United States Patent
Han

(10) Patent No.: US 7,790,605 B2
(45) Date of Patent: Sep. 7, 2010

(54) FORMATION OF INTERCONNECTS THROUGH LIFT-OFF PROCESSING

(75) Inventor: Jae-Won Han, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 116 days.

(21) Appl. No.: 11/644,834

(22) Filed: Dec. 26, 2006

(65) Prior Publication Data

US 2007/0152337 A1 Jul. 5, 2007

(30) Foreign Application Priority Data

Dec. 29, 2005 (KR) .................. 10-2005-0133826

(51) Int. Cl.
*H01L 21/4763* (2006.01)
*H01L 21/44* (2006.01)
(52) U.S. Cl. .............................. 438/627; 257/E21.587; 438/640; 438/643; 438/670; 438/951
(58) Field of Classification Search ................ 438/622, 438/627, 640, 643, 670, 951; 257/E21.587
See application file for complete search history.

(56) References Cited

U.S. PATENT DOCUMENTS

| | | | | |
|---|---|---|---|---|
| 4,171,240 A | * | 10/1979 | Wong | 216/87 |
| 4,640,738 A | * | 2/1987 | Fredericks et al. | 438/605 |
| 4,805,683 A | * | 2/1989 | Magdo et al. | 216/40 |
| 4,933,303 A | * | 6/1990 | Mo | 438/629 |
| 5,571,753 A | * | 11/1996 | Saruwatari | 438/527 |
| 5,679,608 A | * | 10/1997 | Cheung et al. | 438/622 |
| 6,455,940 B2 | | 9/2002 | Satou | |
| 6,596,616 B1 | * | 7/2003 | Holm et al. | 438/597 |
| 2001/0051420 A1 | | 12/2001 | Besser et al. | |
| 2004/0063317 A1 | * | 4/2004 | Sun et al. | 438/689 |
| 2004/0169213 A1 | * | 9/2004 | Farrar | 257/295 |

(Continued)

FOREIGN PATENT DOCUMENTS

CN 1649125 8/2005

OTHER PUBLICATIONS

Office Action issued on Aug. 8, 2008, from the State Intellectual Property Office of the People's Republic of China in counterpart Chinese Application No. 200610172421.8.

*Primary Examiner*—Hsien-ming Lee
*Assistant Examiner*—Kevin Parendo
(74) *Attorney, Agent, or Firm*—Finnegan, Henderson, Farabow, Garrett & Dunner, L.L.P.

(57) ABSTRACT

A semiconductor device is provided. The semiconductor device includes a semiconductor substrate including a conducting layer, a first insulating film formed on the semiconductor substrate and having a via hole formed therein, a lower barrier film formed on an inside wall of the via hole, a first metal wiring formed on the lower barrier film, a second insulating film formed on the first metal wiring and the first insulating film, the second insulating film being provided with a trench which has a width greater than a width of the via hole, an upper barrier film formed on a lower surface of the trench, a second metal wiring formed on the upper barrier film, and a sidewall barrier film formed on sidewalls of the upper barrier film and the second metal wiring. The sidewall barrier film has an L-shaped mirror-symmetrical structure.

8 Claims, 9 Drawing Sheets

U.S. PATENT DOCUMENTS

2005/0026329 A1 2/2005 Kim et al.
2005/0186793 A1 8/2005 Omoto et al.
2006/0194349 A1* 8/2006 Preusse et al. .................. 438/5
2006/0234483 A1* 10/2006 Araki et al. ................. 438/551

* cited by examiner

FORMATION OF INTERCONNECTS THROUGH LIFT-OFF PROCESSING

RELATED APPLICATION

This application is based upon and claims the benefit of priority to Korean Application No. 10-2005-0133826, filed on Dec. 29, 2005, the entire contents of which are incorporated herein by reference.

TECHNICAL FIELD

The present invention relates to a semiconductor device and a manufacturing method therefor, and more particularly, to a semiconductor device having a metal wiring and a manufacturing method therefor.

BACKGROUND

Generally, metal wirings of semiconductor devices are formed by using metal thin films made of metals such as Al or Cu etc., and electrical connections and pad connections between the semiconductor devices allow circuits formed in a semiconductor substrate to be connected to each other.

Such metal wiring for connecting device electrodes and pads separated by an insulating film such as an oxide film or the like are formed through dual damascene process including a step of selectively etching the insulating film to form a via hole, filling an inside of the via hole with a filling film by using a photosensitive film, forming a trench pattern on the insulating film by using the photosensitive film, etching the insulating film to form a trench by using the trench pattern as a mask, removing the trench pattern and the filling film, and filling the inside of the via hole and the inside of the trench with the metal film.

A plurality of metal wirings formed through the dual damascene process described above may be formed with a multiple-layered structure. In such a case, there may exist parasitic capacitances between upper and lower overlapping and parasitic capacitances between neighboring metal wirings, thereby decreasing the operational speed of the semiconductor device.

Accordingly, in order to reduce the parasitic capacitances, the insulating film for surrounding and supporting the metal wirings is conventionally made of a lower dielectric (low-k) material.

Meanwhile, the via holes are filled with a film having an etching selectivity lower than that of the insulating film. That is, if the insulating film and the photosensitive film are simultaneously etched for an arbitrary predetermined time period, the amount of the photosensitive film etched away is smaller than that of the insulating film. As a result, fences are formed on a lower surface of the trench due to the difference in the etching selectivity between the insulating film and the photosensitive film. The height of the fences made as described above may be lowered by a following process such as a process for removing the photosensitive film positioned within the via hole, but the fences may not be completely removed.

Accordingly, when the trench and the via hole are filled with a metal thin film, a height difference generated by the fences causes the trench and the via hole to be incompletely filled with the metal thin film, and a crack may develop at the metal wirings. This may increase the resistance of the metal wirings, adversely affecting the characteristics of the semiconductor device, degrading its reliability.

Also, residues generated by performing the etching process of the low-k material using the dual damascene process two times are left on the inside walls of the via hole and the trench. The residues increase the resistance of the semiconductor device, decreasing the operational speed of the semiconductor device.

In addition, when the low-K material is patterned through the dual damascene process, the low-K material exposed by performing the asher process and an asher liquid are chemically reacted to increase the dielectric constant (K) of the low-K material. As a result, the operational speed of the semiconductor device may be lowered.

BRIEF SUMMARY

Accordingly, consistent with the present invention there is provided a method for manufacturing a semiconductor device which may reduce the dielectric constant (K) of an inter-metal insulating film and residues generation, thereby improving the operational speed of the semiconductor device.

Consistent with the present invention, there is provided a semiconductor device including: a semiconductor substrate including a conducting layer; a first insulating film formed on the semiconductor substrate and having a via hole formed therein; a lower barrier film formed on an inside wall of the via hole; a first metal wiring formed on the lower barrier film; a second insulating film formed on the first metal wiring and the first insulating film, the second insulating film being provided with a trench which has a width greater than a width of the via hole; an upper barrier film formed on a lower surface of the trench; a second metal wiring formed on the upper barrier film; and a sidewall barrier film formed on sidewalls of the upper barrier film and the second metal wiring, wherein the sidewall barrier film has an L-shaped mirror-symmetrical structure.

Consistent with the present invention, there is also provided a method of manufacturing a semiconductor device comprising: forming a first insulating film on a semiconductor substrate; embedding a first metal wiring in the first insulating film; forming a first photosensitive film on the first insulating film, the first photosensitive film having a first trench for exposing the first metal wiring and a portion of the first insulating film; forming a second barrier film on a resulting upper structure of the semiconductor substrate; forming a metal thin film on the second barrier film; forming a second metal wiring by removing the first photosensitive film; forming a second photosensitive film on the first insulating film, wherein a region corresponding to the second metal wiring serves as a second trench; forming a third barrier film on a resulting upper structure of the semiconductor substrate; removing the second photosensitive film; and forming a second insulating film on the first insulating film and the second metal wiring.

BRIEF DESCRIPTION OF THE DRAWINGS

The above features and advantages will be more clearly understood from the following detailed description taken in conjunction with the accompanying drawings, in which.

DETAILED DESCRIPTION

Figure 1:
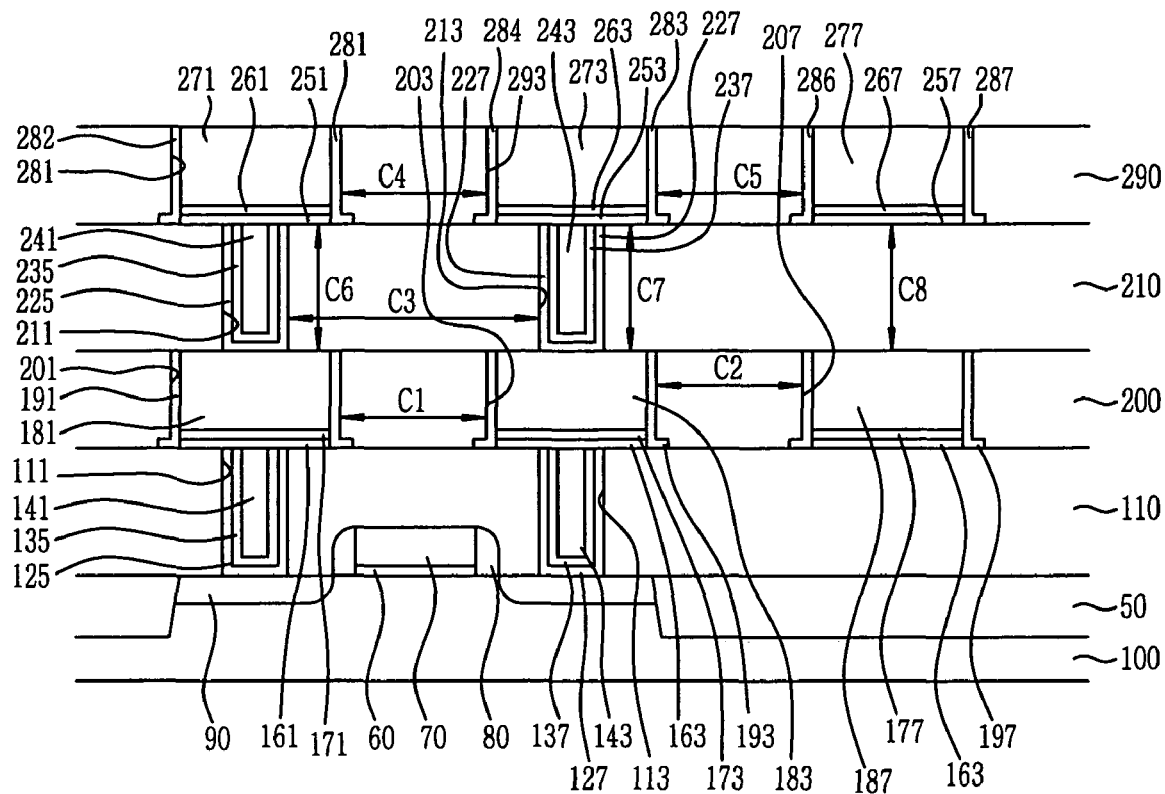
FIG. 1 is a sectional view illustrating a structure of a semiconductor device consistent with the present invention.

The present invention will be described in detail with reference to the accompanying drawings in order that preferred embodiments may be easily executed by those skilled in the art. However, the present invention may be implemented in various different modifications and is not limited to the preferred embodiments as set forth herein.

In the drawings, in order to represent various layers and regions in a clear manner, their thicknesses are represented to be enlarged. Through the entire specification, like elements are designated by the same reference numerals. If a portion such as a layer, a film, a region or a plate is referred to be positioned "on" another portion, such an expression may incorporate a case in which there exists still another portion therebetween as well as a case in which the portion is positioned directly on said another portion. On the contrary, if a portion is referred to be positioned "directly on" another portion, it means that there is no other portion therebetween.

Hereinafter, a semiconductor device and a manufacturing method therefor in accordance with the present invention will be described with reference to the accompanying drawings.

FIG. 1 is a sectional view illustrating a structure of a semiconductor device in accordance with an embodiment of the present invention, and FIGS. 2 to 11 are views illustrating a method for manufacturing the semiconductor device in a sequence of manufacturing processes consistent with the embodiment of the present invention.

First, a structure of a semiconductor device will be described in detail with reference to FIG. 1

As shown in FIG. 1, a gate insulating film 60 and a gate electrode 70 are sequentially formed on a semiconductor substrate 100 on which a device separating film 50 is formed. Spacers 80 are formed on sidewalls of gate insulating film 60 and gate electrode 70. High concentration junction regions 90 are formed in an exposed part of semiconductor substrate 100. A lower interlayer insulating film 110 having lower via holes 111 and 113 for respectively exposing the high concentration junction regions 90 of semiconductor substrate 100 is formed on an entire surface of a resulting upper structure of semiconductor substrate 100. Lower via barrier films 125 and 127 are formed on inside surfaces of the lower via holes 111 and 113 respectively and lower via seed films 135 and 137 are formed on inside surfaces of lower via barrier films 125 and 127 respectively. Lower via metal wirings 141 and 143 are formed in lower voids which are respectively defined by lower via seed films 135 and 137 in such a manner as to fill the lower voids. A lower wiring insulating film 200 having lower trenches 201, 203 and 207 is formed on an entire surface of a resulting upper structure of semiconductor substrate 100 wherein lower trenches 201, 203 expose lower via metal wirings 141 and 143 respectively. Lower trench barrier films 161, 163 and 167, lower trench seed films 171, 173 and 177 and lower trench metal wirings 181, 183 and 187 are sequentially formed within lower trenches 201, 203 and 207, respectively. Lower sidewall barrier films 191, 193 and 197 are formed in L-shaped mirror-symmetrical structures on sidewalls of lower trench barrier films 161, 163 and 167, lower trench seed films 171, 173 and 177 and lower trench metal wirings 181, 183 and 187, respectively. An upper interlayer insulating film 210 having upper via holes 211 and 213 for respectively exposing lower trench metal wirings 181 and 183 is formed on an entire surface of a resulting upper structure of semiconductor substrate 100. Upper via barrier films 225 and 227 and upper via seed films 235 and 237 are sequentially formed on inside surfaces of upper via holes 211 and 213, respectively. Upper via metal wirings 241 and 243 for filling the insides of upper via holes 211 and 213 are formed on upper via seed films 235 and 237, respectively so that they fill upper voids defined each of upper via seed films 235 and 237. An upper wiring insulating film 290 having upper trenches 291, 293 and 297 for respectively exposing portions of upper via metal wirings 241 and 243 and a portion of upper interlayer insulating film 210 is formed on upper interlayer insulating film 210 and upper via metal wirings 241 and 243. Upper trench barrier films 251, 253 and 257, upper trench seed films 261, 263 and 267 and upper trench metal wirings 271, 273 and 277 are sequentially formed within upper trenches 291, 293 and 297, respectively. Upper sidewall barrier films 281, 283 and 287 are formed in approximately L-shaped mirror-symmetrical structures on sidewalls of the upper trench barrier films 251, 253 and 257, upper trench seed films 261, 263 and 267, and upper trench metal wirings 271, 273 and 277, respectively.

Herein, lower interlayer insulating film 110 and upper interlayer insulating film 210 may be composed of FSG (fluoride-doped silicate glass), PSG (phosphorous-doped silicate glass), USG (undoped silicate glass), BPSG (boron phosphorous doped silicate glass), silicon oxide material, etc., and it is preferable that they have a thickness of about 1,000 Å or more.

Lower wiring insulating film 200 and upper wiring insulating film 290 are composed of a low-K material including SiOC.

A method for manufacturing a semiconductor device will now be described in detail with reference to FIGS. 2 to 11.

Figure 2:
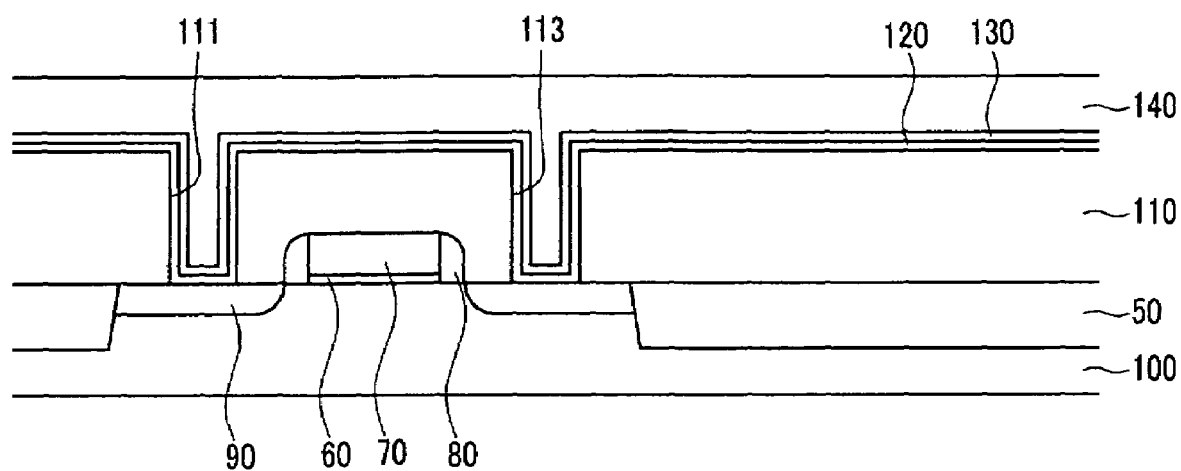
FIGS. 2 to 11 are views illustrating a method for manufacturing a semiconductor device in a sequence of manufacturing processes consistent with the present invention.

As shown in FIG. 2, gate insulating film 60 and gate electrode 70 are sequentially formed on semiconductor substrate 100 on which device separating film 50 for serving as a shallow trench isolation (STI) is formed. Spacers 80 are formed on the sidewalls of gate insulating film 60 and gate electrode 70. A high concentration of impurity ions is implanted into the exposed semiconductor substrate 100 to form high concentration junction regions 90. Lower interlayer insulating film 110 having lower via holes 111 and 113 for respectively exposing high concentration junction regions 90 is formed on an entire surface of a resulting upper structure of semiconductor substrate 100. An asher process is performed on the entire surface of the upper structure of semiconductor substrate 100. Then, a lower via barrier film 120 is formed on lower interlayer insulating film 110 and the exposed semiconductor substrate 100. A lower via seed film 130 is formed on lower via barrier film 120. A first metal thin film 140 is formed on lower via seed film 130. Herein, lower interlayer insulating film 110 may be composed of FSG (fluoride-doped silicate glass), PSG (phosphorous-doped silicate glass), USG (undoped silicate glass), BPSG (boron phosphorous doped silicate glass), silicon oxide material, etc., and it is preferable that it has a thickness of about 1,000 Å or more. Also, first metal thin film 140 is preferably composed of Cu.

Figure 3:
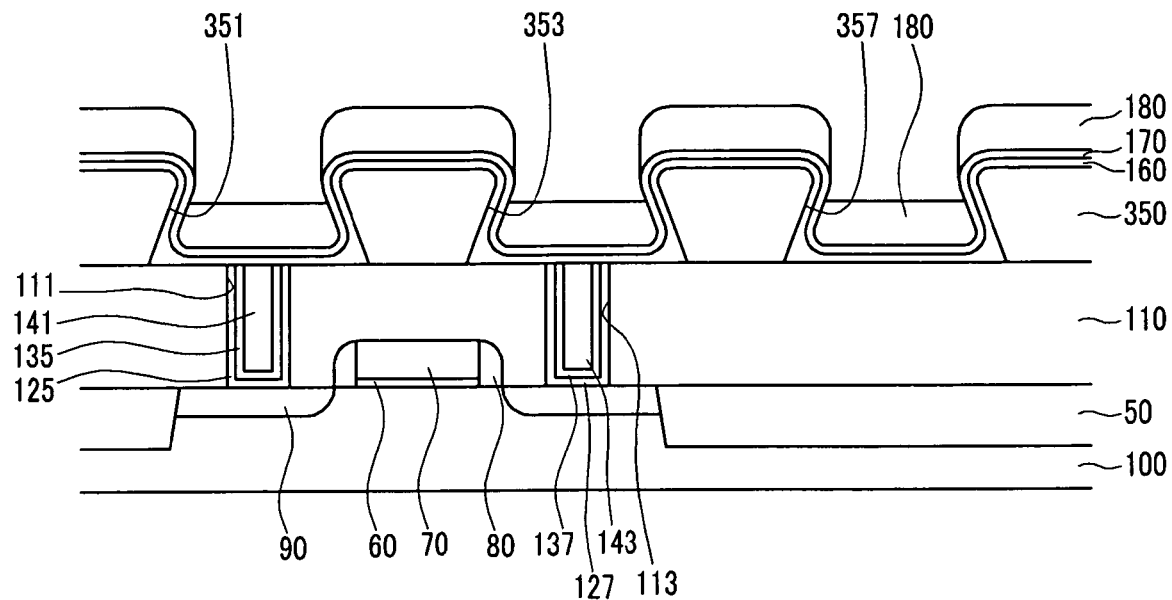

Then, as shown in FIG. 3, a chemical mechanical polishing (CMP) process is carried out to remove a portion of lower via barrier film 120, a portion of lower via seed film 130, and a portion of first metal thin film 140 which are positioned on the top of lower interlayer insulating film 110. Next, a planarization process is performed to form lower via metal wirings 141 and 143. At this time, lower via barrier films 125 and 127 and lower via seed films 135 and 137 are partially remained only on the inside surfaces of lower via holes 111 and 113, respectively.

Subsequently, on the entire surface of the resulting upper structure of semiconductor substrate 100 a first photosensitive film 350 of a slant pattern which has first and second trenches 351 and 353 for exposing a portion of lower interlayer insulating film 110 and for respectively exposing lower via metal wirings 141 and 143, and a third trench 357 for exposing a portion of lower interlayer insulating film 110 is formed. Then, semiconductor substrate 100 having the resulting upper structure described above is immersed in trichloroethylene (TCE) for several seconds to harden the outer surface of first photosensitive film 350. At this time, first, second and third trenches 351, 353 and 357 have their respective widths, each width being gradually tapered from its lower part and ending at its upper part.

Subsequently, a lower trench barrier layer 160 is formed on first photosensitive film 350, lower via metal wirings 141 and 143 and partially exposed lower interlayer insulating film 110. On lower trench barrier layer 160 a lower trench seed layer 170 is formed. On lower trench seed layer 170 is formed a second metal thin film 180. At this time, first photosensitive film 350 having the slant pattern causes second metal thin film 180 to be positioned over the outer surface of first photosensitive film 350, and allows the insides of first, second and third trenches 351, 353 and 357 to be partially filled with second metal thin film 180.

Herein, it is preferable that second metal thin film 180 is composed of Cu.

Figure 4:
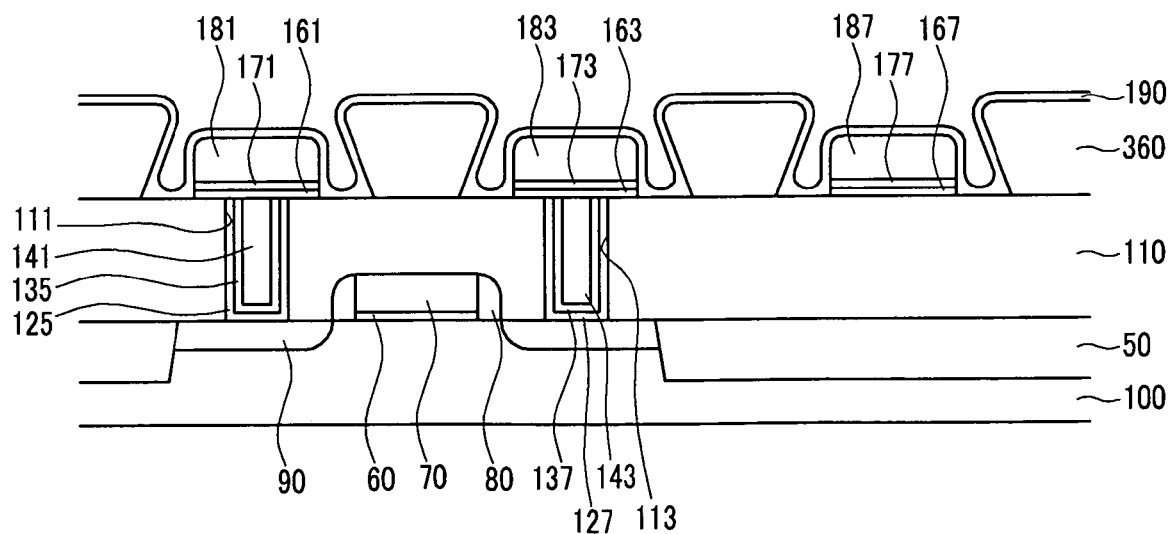

Then, first photosensitive film 350 is removed as shown in FIG. 4. At this time, as described above, since the inner portion of first photosensitive film 350 including a part thereof which contacts lower interlayer insulating film 110 has a hardness lower than that of the outer portion thereof, the removal of first photosensitive film 350 results in the removal of lower trench barrier layer 160, lower trench seed layer 170 and second metal thin film 180 which are positioned on first photosensitive film 350.

Specifically, lower trench barrier layer 160 is partially removed to form lower trench barrier films 161, 163 and 167 which are contacted with lower via metal wirings 141 and 143 and lower interlayer insulating film 110, respectively. And, lower trench seed layer 170 is partially removed to form lower trench seed films 171, 173 and 177 which contact lower trench barrier films 161, 163 and 167, respectively. Further, only some portions of second metal thin film 180 which contact lower trench seed films 171, 173 and 177 are left to form lower trench metal wirings 181, 183 and 187, respectively.

Subsequently, a second photosensitive film 360 having a slant pattern is formed on an exposed portion of lower interlayer insulating film 110. Then, semiconductor substrate 100 having the resulting upper structure thereof is immersed in trichloroethylene (TCE) for several seconds to harden the outer surface of second photosensitive film 360.

Thereafter, a lower sidewall barrier layer 190 is formed on second photosensitive film 360 and lower trench metal wirings 181, 183 and 187.

Figure 5:
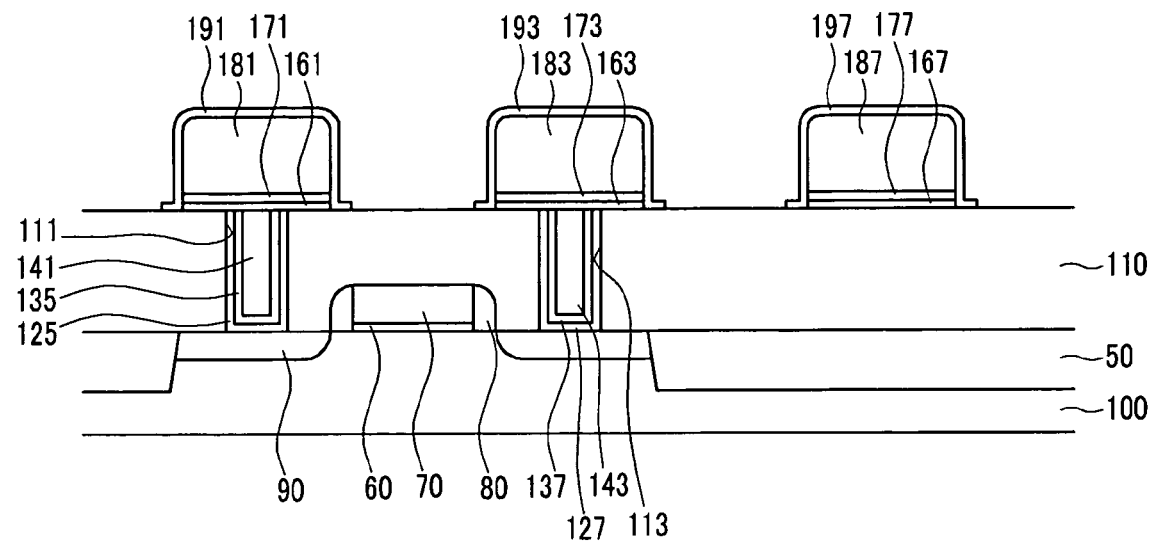

Then, second photosensitive film 360 is removed as shown in FIG. 5. At this time, as described above, since the inner portion of second photosensitive film 360 including a part thereof which contacts outer interlayer insulating film 110 has a hardness lower than that of the upper portion of second photosensitive film 360, the removal of the second photosensitive film 360 results in the removal of some portions of lower sidewall barrier layer 190 which are positioned on second photosensitive film 360.

As a result, the remaining portions of lower sidewall barrier layer 190 are left as lower sidewall barrier films 191, 193 and 197. Lower sidewall barrier films 191, 193 and 197 are formed on the sidewalls of lower trench barrier films 161, 163 and 167, lower trench seed films 171, 173 and 177 and lower trench metal wirings 181, 183 and 187, respectively to have approximately L-shaped mirror-symmetrical structures as will be described later.

Figure 6:
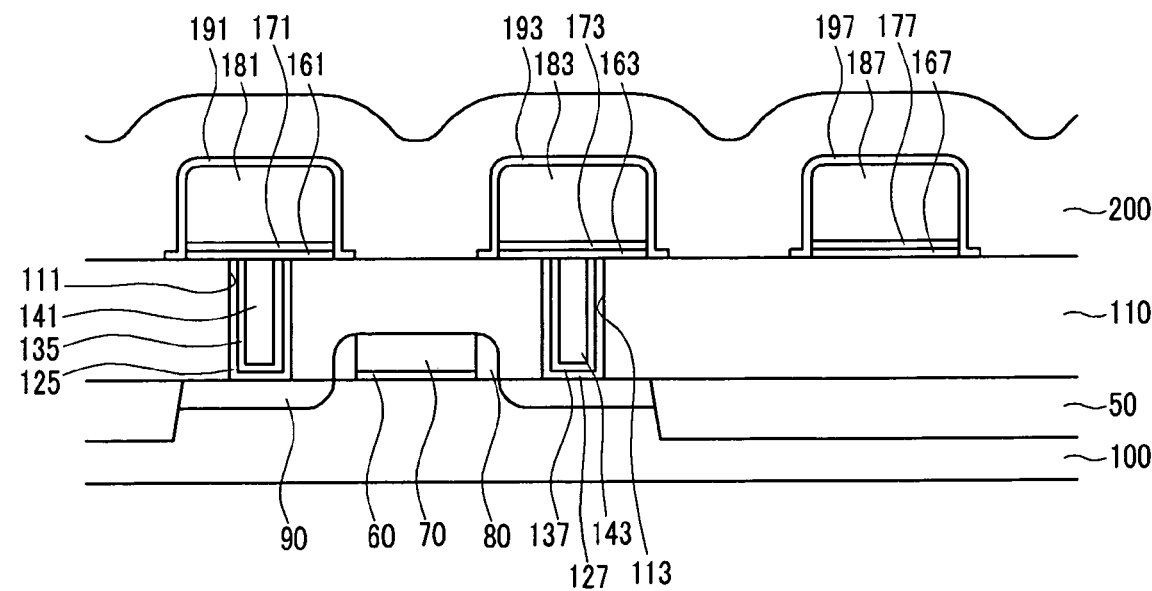

Then, lower wiring insulating film 200 is formed on the entire surface of the resulting structure of semiconductor substrate 100 as shown in FIG. 6.

Figure 7:
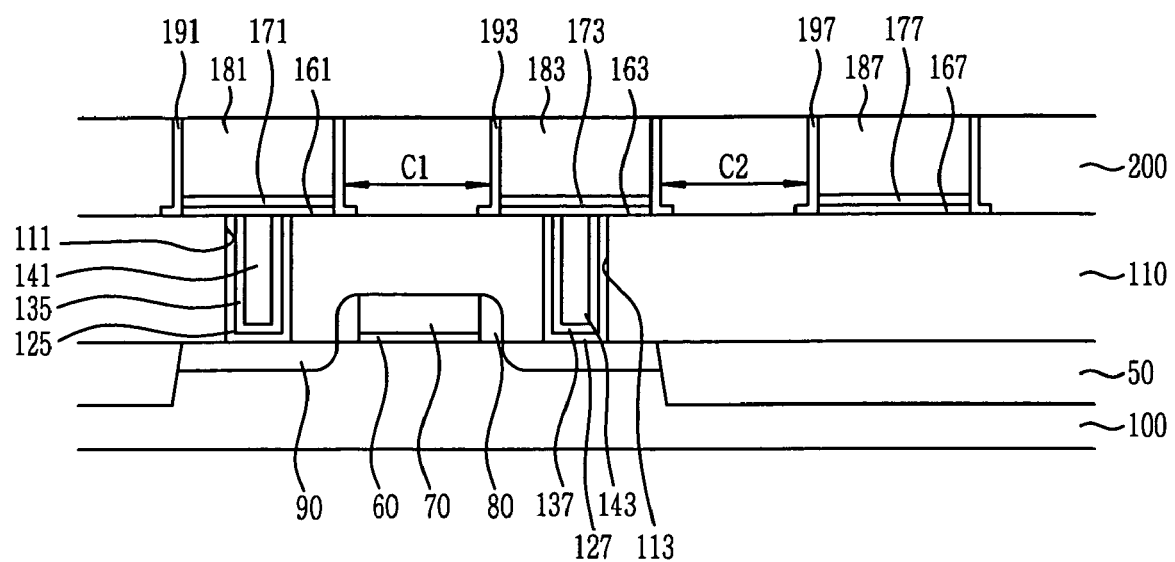

Thereafter, as shown in FIG. 7, a CMP process is performed to planarize lower wiring insulating film 200. At this time, some portions of lower sidewall barrier layer 190 which is positioned on top surfaces of the lower trench metal wirings 181, 183 and 187 are removed, so that lower sidewall barrier films 191, 193 and 197 may be left as the L-shaped mirror-symmetrical structures on sidewalls of the lower trench barrier films 161, 163 and 167, lower trench seed films 171, 173 and 177 and lower trench metal wirings 181, 183 and 187, respectively.

Herein, parasitic capacitances C1 and C2 exist between two neighboring lower trench metal wirings of lower trench metal wirings 181, 183 and 187. However, as described above, since the dielectric substance for surrounding and supporting the neighboring lower trench metal wirings 181, 183 and 187 is made of a low-K material, the parasitic capacitances C1 and C2 have little effect on the operation of the semiconductor device.

Herein, lower trench metal wirings 181 and 183 and lower via metal wirings 141 and 143 are electrically connected to each other to form lower metal wirings, respectively.

As described above, unlike the prior art in which the dual damascene process is used to form the lower metal wiring, the single damascene process is used to form lower via metal wirings 141 and 143 consistent with the present invention, and then first and second photosensitive films 350 and 360 having the slant pattern are used to form lower trench metal wirings 181, 183 and 187, thereby allowing the lower metal wirings to be formed consistent with the present invention.

As a result, since the present invention does not perform a conventional process in which the dual damascene process is used to fill an inside of a via hole with a photosensitive film and to form a trench, fences are not formed and byproducts which could be conventionally generated by the removal of the photosensitive film filling the inside of the via hole are also not formed. Accordingly, voids cannot be generated in the lower metal wirings, so that the electrical characteristics of the semiconductor device and the reliability thereof may be improved.

Also, as described above, since lower interlayer insulating film 110 for surrounding and supporting lower via metal wirings 141 and 143 is made of a material such as $SiO_2$ or FSG etc. and the lower wiring insulating film 200 for surrounding and supporting lower trench metal wirings 181, 183 and 187 is made of the low-K material, the low-K material is exposed so that the asher process is performed only once. However, the asher process should be performed three times to the exposed low-K material in the conventional process in which the metal wiring is formed by patterning the via hole and the trench by means of the dual damascene process. Accordingly, the asher process consistent with the present invention may prevent the dielectric constant (K) from increasing due to the chemical reaction of the low-K material and the asher liquid, thereby preventing the operational speed of the semiconductor device from being decreased.

Figure 8:
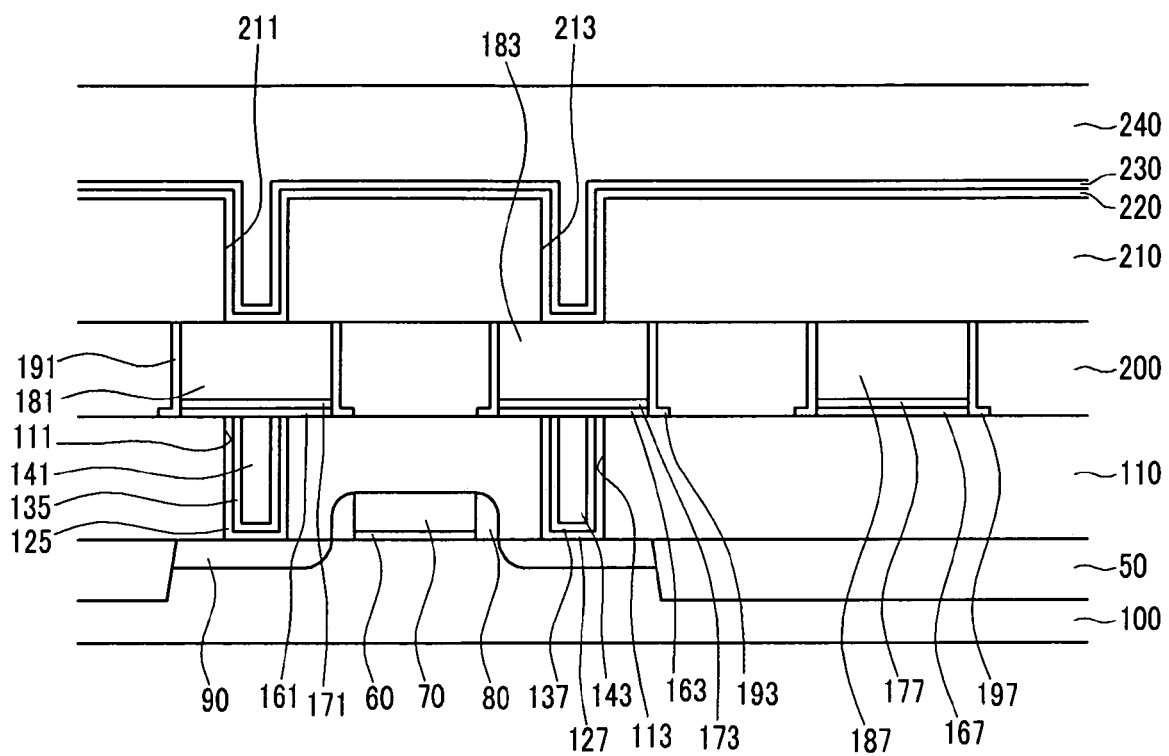

Then, as shown in FIG. 8, upper insulating film 210 is formed on lower wiring insulating film 200 and lower trench metal wirings 181, 183 and 187. Upper interlayer insulating film 210 has upper via holes 211 and 213 formed therein for exposing lower trench metal wirings 181 and 183. On upper interlayer insulating film 210 and the exposed lower trench metal wirings 181 and 183 is formed an upper via barrier film 220. On upper via barrier film 220 is formed an upper via seed film 230. On upper via seed film 230 is formed a third metal thin film 240. It is preferable that upper interlayer insulating film 210 is made of the same material as the lower interlayer insulating film 110 made of FSG (fluoride-doped silicate glass), PSG (phosphorous-doped silicate glass), USG (undoped silicate glass), BPSG (boron phosphorous doped silicate glass), and silicon oxide material etc. and has a thickness of about 1,000 Å or more.

Figure 9:
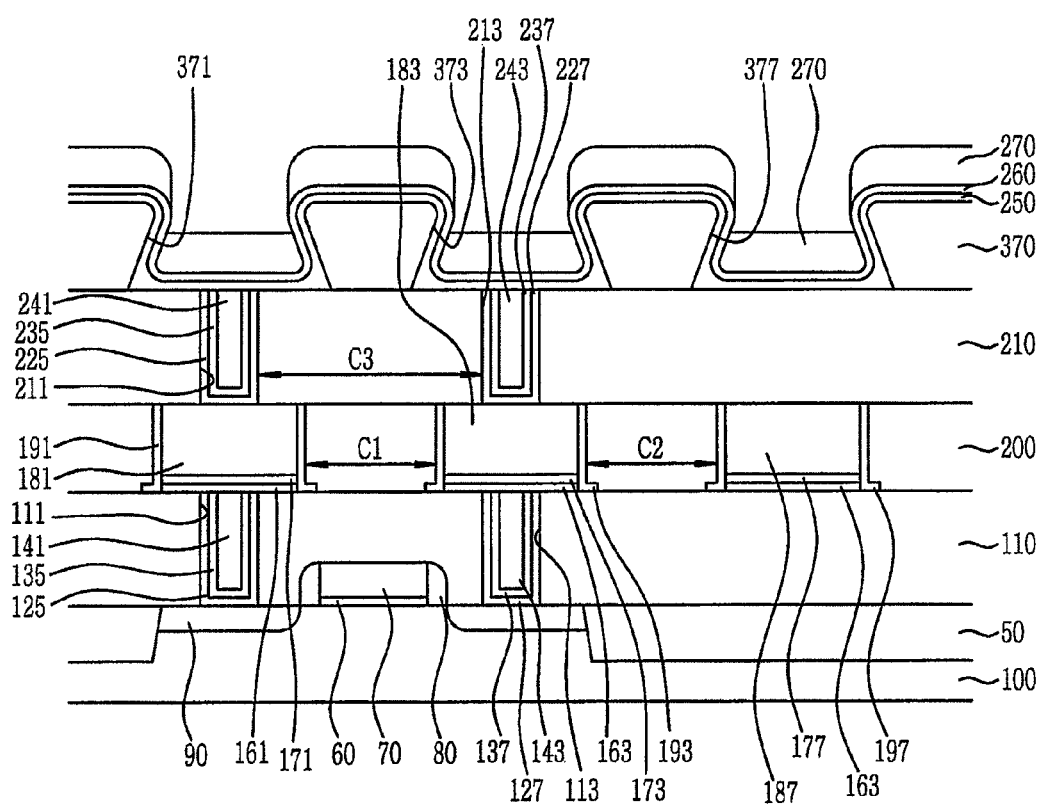

Then, as shown in FIG. 9, a CMP process is used to remove a portion of upper via barrier film 220 portion, a portion of upper via seed film 230, and a portion of third metal thin film 240 which are positioned on the top of upper interlayer insulating film 210. Next, a planarization process is performed to form upper via metal wirings 241 and 243. As a result, upper via barrier films 225 and 227 and upper via seed films 235 and 237 are left only on the inside walls of upper via holes 211 and 213, respectively.

Herein, a parasitic capacitance C3 exists between the neighboring upper via metal wirings 241 and 243. However, since the interval between upper via metal wirings 241 and 243 is relatively larger than a distance between two neighboring lower trench metal wirings of lower trench metal wirings 181, 183 and 187 in which parasitic capacitances C1 and C2 are generated, parasitic capacitance C3 may be ignored during the operation of the semiconductor device.

Subsequently, on the entire surface of the resulting upper structure of the semiconductor substrate 100 is formed a third photosensitive film 370 of a slant pattern which has fourth and fifth trenches 371 and 373 for exposing a portion of the upper interlayer insulating film 210 and for respectively exposing the upper via metal wirings 241 and 243, and a sixth trench 377 for exposing a portion of upper interlayer insulating film 210. Then, semiconductor substrate 100 having the resulting upper structure described above is immersed in trichloroethylene (TCE) for several seconds to harden the outer surface of third photosensitive film 370. At this time, fourth, fifth and sixth trenches 371, 373 and 377 have their respective widths, each width being tapered more and more from its lower part to its upper part.

Subsequently, on third photosensitive film 370, upper via metal wirings 241 and 243 and partially exposed upper interlayer insulating film 210 is formed an upper trench barrier layer 250. On upper trench barrier layer 250 is formed an upper trench seed layer 260. On upper trench seed layer 260 is formed a fourth metal thin film 270. At this time, third photosensitive film 370 having the slant pattern causes fourth metal thin film 270 to be positioned over outer surface of third photosensitive film 370, and allows the insides of fourth, the fifth and the sixth trenches 371, 373 and 377 to be partially filled with fourth metal thin film 270.

Herein, it is preferable that fourth metal thin film 270 is composed of Cu.

Figure 10:
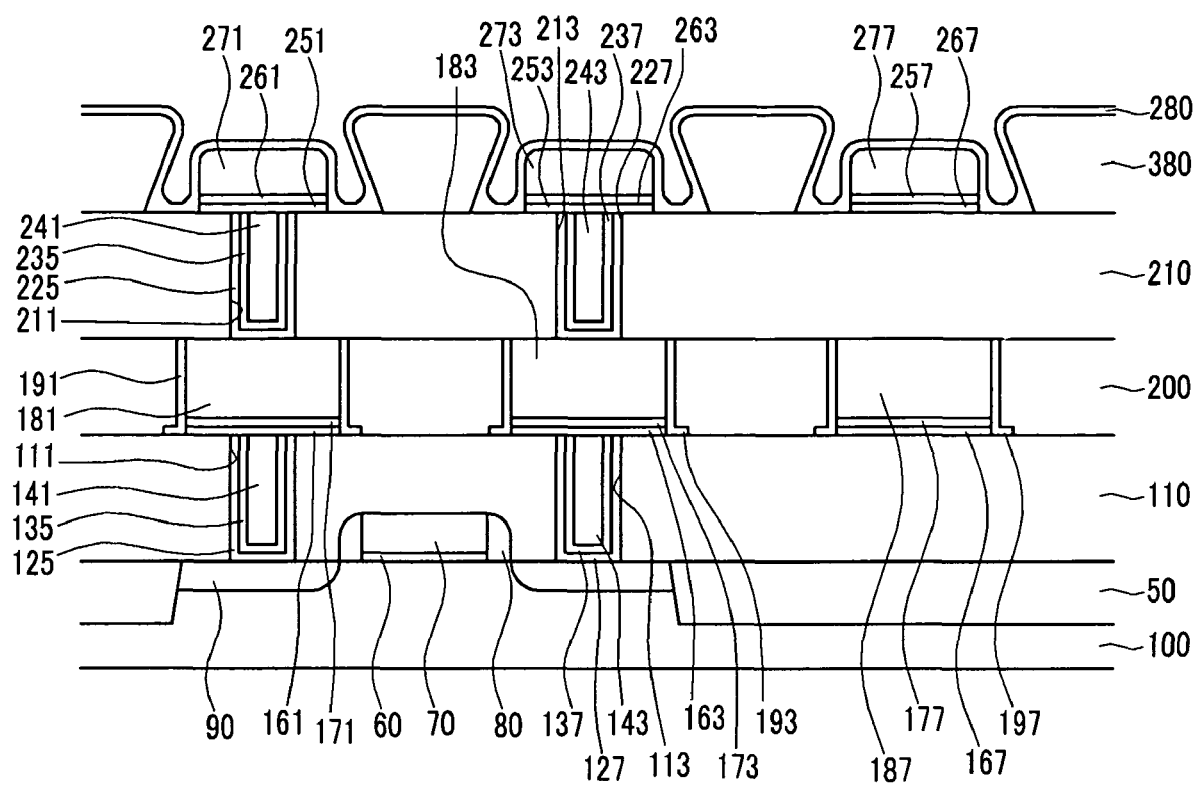

Then, third photosensitive film 370 is removed as shown in FIG. 10. At this time, as described above, since the inner portion of third photosensitive film 370 including a part thereof which is contacted with upper interlayer insulating film 210 has a hardness lower than that of the upper portion of third photosensitive film 370, the removal of third photosensitive film 370 results in the removal of upper trench barrier layer 250, upper trench seed layer 260 and fourth metal thin film 270 which are positioned on third photosensitive film 370.

Specifically, upper trench barrier layer 250 is partially removed to form upper trench barrier films 251, 253 and 257 which are respectively contacted with upper via metal wirings 241 and 243 and upper interlayer insulating film 210. And, upper trench seed layer 260 is partially removed to form upper trench seed films 261, 263 and 267 which are contacted with upper trench barrier films 251, 253 and 257, respectively. Further, only some portions of fourth metal thin film 270 which are contacted with upper trench seed films 261, 263 and 267 are left to form upper trench metal wirings 271, 273 and 277, respectively.

Subsequently, a fourth photosensitive film 380 having a slant pattern is formed on an exposed portion of upper interlayer insulating film 210. Then, semiconductor substrate 100 having the resulting upper structure thereof is immersed in trichloroethylene (TCE) for several seconds to harden the outer surface of fourth photosensitive film 380.

Thereafter, an upper sidewall barrier layer 280 is formed on fourth photosensitive film 380 and upper trench metal wirings 271, 273 and 277.

Figure 11:
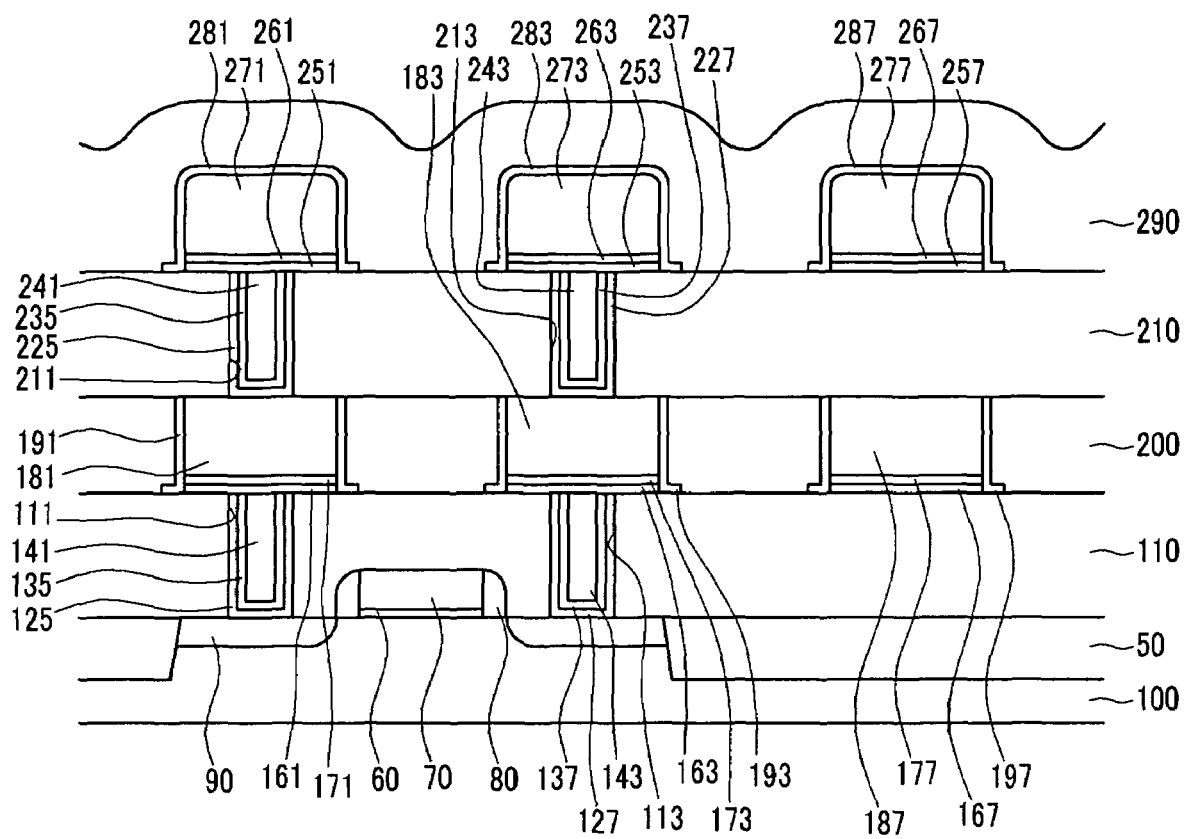

Then, fourth photosensitive film 380 is removed as shown in FIG. 11. At this time, as described above, since the inner portion of fourth photosensitive film 380 including a portion thereof which is contacted with outer interlayer insulating film 210 has a hardness lower than that of the outer portion of fourth photosensitive film 380, the removal of fourth photosensitive film 380 results in the removal of some portions of upper sidewall barrier layer 280 which are positioned on fourth photosensitive film 380.

As a result, upper sidewall barrier layer 280 is left as upper sidewall barrier films 281, 283 and 287. Upper sidewall barrier films 281, 283 and 287 are formed on the sidewalls of upper trench barrier films 251, 253 and 257, upper trench seed films 261, 263 and 267 and upper trench metal wirings 271, 273 and 277 respectively to have approximately L-shaped mirror-symmetrical structure as shown in FIG. 1.

Then, upper wiring insulating film 290 is formed on the entire surface of the resulting semiconductor substrate 100.

Thereafter, as shown in FIG. 1, a CMP process is used to planarize upper wiring insulating film 290. At this time, a portion of upper sidewall barrier layer 280 which is positioned on the top surfaces of upper trench metal wirings 271, 273 and 277 are removed, so that upper sidewall barrier films 281, 282, 283, 284, 286 and 287 may be left as the L-shaped mirror-symmetrical structures on the sidewalls of upper trench barrier films 251, 253 and 257, upper trench seed films 261, 263 and 267 and upper trench metal wirings 271, 273 and 277, respectively.

Herein, parasitic capacitances C4 and C5 exist between two neighboring upper trench metal wirings of upper trench metal wirings 271, 273 and 277. However, as described above, since the dielectric substance of parasitic capacitances C4 and C5 generated by the neighboring upper trench metal wirings 271, 273 and 277 is made of the low-K material, parasitic capacitance C4 has little effect on the operation of the semiconductor device.

Further, parasitic capacitances C6, C7 and C8 exist between the portions in which lower trench metal wirings 181, 183 and 187 and upper trench metal wirings 271, 273 and 277 respectively overlap. However, as described above, since upper interlayer insulating film 210 which exists between lower trench metal wirings 181, 183 and 187 and upper trench metal wirings 271, 273 and 277 and which serves as the dielectric material for parasitic capacitances C6, C7 and C8 has a thickness of about 1,000 Å or more, the distances between lower trench metal wirings 181, 183 and 187 and the upper trench metal wirings 271, 273 and 277 may be long enough to ignore their corresponding parasitic capacitances C6, C7 and C8 during the operation of the semiconductor device.

Herein, upper trench metal wirings 271 and 273 and upper via metal wirings 241 and 243 are electrically connected to each other to form upper metal wirings 305 and 308, respectively.

Consistent with the present invention, the single damascene process is used to make the via metal wirings, and the photosensitive film having the slant pattern is used as a mask to form the trench metal wirings, which have widths wider than those of the via metal wirings, for being electrically connected with the via metal wirings, thereby allowing the complete metal wirings to be formed. Accordingly, since the present invention does not perform a conventional process in which the dual damascene process is used to fill an inside of a via hole with a photosensitive film and to form a trench, there are neither fences which could be formed at the bottom of the trench due to the difference in the etching selectivity between the insulating film and the photosensitive film filling the via hole nor byproducts which could be conventionally generated due to the removal of the photosensitive film for filling the inside of the via hole. As a result, voids cannot be generated in the metal wirings, so that the electrical characteristic of the semiconductor device and the reliability thereof may be improved.

Furthermore, while the asher process should be conventionally performed three times on the low-K material exposed by the dual damascene process, consistent with the present invention the asher process may be performed only once. This prevents the dielectric constant (K) from increasing due to the chemical reaction of the low-K material and the asher liquid of the asher process, thereby allowing an increased operational speed of the semiconductor device.

Also, since the insulating film for surrounding and supporting the trench metal wirings is made of the low-K material including $SiO_2$ which is a low dielectric material, the parasitic capacitance between neighboring trench metal wirings may be minimized. Furthermore, the insulating film for surrounding and supporting the via metal wirings is formed by depositing the insulating film with a thickness of about 1,000 Å or more, wherein the insulating film is made of $SiO_2$, FSG or the like of allowing the patterning process to be easily performed. As a result, it is possible to minimize the parasitic capacitance which is generated between trench metal wirings overlapped upward and downward in multiple-layered metal wirings, thereby allowing the operational speed of the semiconductor device to be increased.

Although the present invention has been described above in detail in connection with the preferred embodiments, it could be understood that various modifications and other embodiments may be executed therefrom by those skilled in the art, without departing from the scope and spirit of the invention. Accordingly, the scope and sprit of the invention is not limited thereto, but may also include various modifications and improvements which could be executed by those skilled in the art by using the fundamental concept of the present invention as defined in the following claims.

What is claimed is:

1. A method of manufacturing a semiconductor device comprising:

forming a first insulating film on a semiconductor substrate;

embedding a first metal wiring in the first insulating film;

forming a first photosensitive film on the first insulating film, the first photosensitive film having a first trench that exposes the first metal wiring and exposes a portion of the first insulating film;

forming a first barrier film on the first photosensitive film and on bottom and side surfaces of the first trench;

forming a metal film on the first barrier film in the first trench and over the first photosensitive film;

forming a second metal wiring by removing the first photosensitive film and portions of the first barrier film and the metal film that are positioned on the first photosensitive film, the second etal wiring being a non-removed portion of the metal film in the first trench, thus leaving a first portion of the first barrier film on a bottom surface of the second metal wiring;

forming a second photosensitive film directly on an exposed portion of the first insulating film, wherein a second trench is formed in the second photosensitive film such that it surrounds the second metal wiring;

forming a second barrier film on the second photosensitive film and the second metal wiring;

removing the second photosensitive film and a portion of the second barrier film that is positioned on the second photosensitive film, to leave portions of the second barrier film on a top and sidewalls of the second metal wiring and on the exposed first insulating film adjacent to the sidewalls; and forming a second insulating film on the first insulating film and the second metal wiring.

2. The manufacturing method as claimed in claim 1, further comprising hardening an outer surface of the first photosensitive film prior to forming the first barrier film.

3. The manufacturing method as claimed in claim 2, wherein hardening the outer surface of the first photosensitive film comprises immersing the first photosensitive film in trichloroethylene (TCE) for a predetermined amount of time.

4. The manufacturing method as claimed in claim 1, further comprising hardening an outer surface of the second photosensitive film prior to forming the second barrier film.

5. The manufacturing method as claimed in claim 4, wherein hardening the outer surface of the second photosensitive film comprises immersing the second photosensitive film in trichloroethylene (TCE) for a predetermined amount of time.

6. The manufacturing method as claimed in claim 1, wherein widths of the first and the second trenches are tapered from their lower portions to their upper portions.

7. The manufacturing method as claimed in claim 1, wherein embedding the first metal comprises:

forming the first insulating film to have via holes on the semiconductor substrate;

forming an initial barrier film on an inside surface of the via holes;

forming a metal layer on the initial barrier film; and planarizing the metal layer.

8. The manufacturing method as claimed in claim 1, further comprising planarizing the second insulating film.

* * * * *